(12) United States Patent
Montijo et al.

(10) Patent No.: US 7,110,898 B2
(45) Date of Patent: Sep. 19, 2006

(54) METHOD FOR DIGITALLY ACQUIRING AND COMPENSATING SIGNALS

(75) Inventors: Allen Montijo, Colorado Springs, CO (US); Martin B. Grove, Manitou Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 50 days.

(21) Appl. No.: 10/898,873

(22) Filed: Jul. 26, 2004

(65) Prior Publication Data

US 2006/0020407 A1    Jan. 26, 2006

(51) Int. Cl.
*G01R 23/02*    (2006.01)

(52) U.S. Cl. .............................. 702/67; 702/66; 702/69; 702/85; 702/89; 345/440.1; 324/76.19

(58) Field of Classification Search ...................... None
See application file for complete search history.

(56) References Cited

U.S. PATENT DOCUMENTS

| | | | | |
|---|---|---|---|---|
| 3,820,074 | A * | 6/1974 | Toman | 340/870.13 |
| 4,553,109 | A * | 11/1985 | Hyatt | 331/25 |
| 5,162,723 | A * | 11/1992 | Marzalek et al. | 324/76.19 |
| 5,914,592 | A * | 6/1999 | Saito | 324/121 R |
| 5,978,742 | A * | 11/1999 | Pickerd | 702/66 |
| 6,061,641 | A * | 5/2000 | Hahn et al. | 702/85 |
| 6,242,899 | B1 * | 6/2001 | Miller | 324/76.24 |
| 6,246,389 | B1 * | 6/2001 | Timm | 345/440.1 |
| 6,463,392 | B1 * | 10/2002 | Nygaard et al. | 702/89 |
| 6,753,677 | B1 * | 6/2004 | Weller et al. | 324/121 R |
| 6,865,496 | B1 * | 3/2005 | Camnitz et al. | 702/69 |
| 6,922,066 | B1 * | 7/2005 | Hidaka | 324/713 |
| 6,958,754 | B1 * | 10/2005 | Alexander et al. | 345/440 |

OTHER PUBLICATIONS

U.S. Appl. No. 10/835,759, filed Apr. 30, 2004, Allen Montijo.

\* cited by examiner

*Primary Examiner*—Carol S. W. Tsai

(57) ABSTRACT

A method of data acquisition for a digital instrument having a bandwidth. The method includes receiving a signal and associated trigger. Using that trigger, a plurality of signal values is sampled at multiple time intervals to create an acquisition record representing a continuous fractional segment of the signal. The plurality of samples meets the Nyquist requirement for the bandwidth but is in error according to at least one known error mechanism. The acquisition record is then processed with DSP techniques to produce a compensated acquisition record corrected for the at least one known error mechanism. Each associated compensated acquisition record is incorporated into a result acquisition record as a segment thereof corresponding to a continuous fractional segment of the signal whose signal values were sampled in an associated instance. An additional signal and additional associated trigger are received. The above steps are then repeated for the additional signal and additional associated trigger.

40 Claims, 6 Drawing Sheets

METHOD FOR DIGITALLY ACQUIRING AND COMPENSATING SIGNALS

BACKGROUND

Digital sampling oscilloscopes (DSOs) generally fall into one of two broad classifications, real time DSO's and equivalent time DSO's. Digital Sampling Oscilloscopes from both classifications sample the analog values of an input signal and then input those samples to an analog to digital converter (ADC), whereupon the resultant digitized values are stored in a memory called an acquisition record.

Real time digital oscilloscopes produce a trace each time they are triggered. They tend to have expensive high performance architectures that are capable of consecutively sampling at high speed a large number of locations along an input waveform. One of their valuable assets is the ability to be triggered for a single event (a single shot), or perhaps infrequently occurring event, thereby providing a detailed record of a non-repetitive, high speed event.

In contrast, equivalent time digital sampling oscilloscopes rely upon the repetitive nature of the input waveform. Different parts of the repetitive input waveform are digitized for each of a series of consecutive triggers. The acquisition records are then combined to produce an equivalent acquisition record.

In both cases there are often elaborate mechanisms that take the completed acquisition record and process the data therein for presentation in a display, which is commonly a raster scan mechanism driven from a frame buffer. A fair degree of complexity resides in selecting and massaging data in the acquisition record and forming it into a displayable image in the frame buffer. The user typically has capability of selecting, after the fact, the time scale (zooming in and out along the X axis) and voltage scale (zooming in and out along the Y axis) with which the trace is to be rendered on the monitor of the oscilloscope. Often this means extensive interpolation, since there is no particular correspondence between the time and voltage granularity with which the sampled, processed data is stored in the acquisition record and the pixel-to-pixel position spacing in the raster scan display mechanism that is to exhibit the trace. In order to display a realistic appearing trace, holes in the displayed trace caused by sampled data falling on either side of a pixel location should not be allowed to occur. In addition, it is common for the trigger event to be located following the start of the acquisition record (negative time) and for the location of the trigger event relative to the start of the displayed portion of the trace to be adjustable (panning).

As digital oscilloscopes are developed to operate at higher and higher frequencies, new classes of difficulties emerge. One such difficulty may be classed as "frequency response" which reveals itself as combination of different causes but which tend to have a similar result: the measured amplitude of a signal is incorrect, and it is the bandwidth consuming components of signals that account for the errors. For example, there is a simple frequency response, where, for example, there is a shunt capacitance that is not compensated in view of a series resistance, resulting in an RC filter. Or, perhaps an amplifier is bandwidth limited, and its frequency response rolls off sooner than desired. Another example is reflected power caused by discontinuities in the transmission lines used to couple the system or device under test to the oscilloscope. While this is a useful phenomenon that is the basis for TDR (Time Domain Reflectometry), and TDR results are often easy to interpret when there is limited bandwidth or only one or two reflections, reflected power also re-reflects off ALL the other discontinuities. The more bandwidth and the greater the voltage resolution the measurement system has, the worse the results appear. When these same results are manifested in a time domain trace of a voltage waveform under measurement, the result often appears to be an unpredictably uneven frequency response that gives the waveform properties that appear to be spurious artifacts. Another source of frequency dependent errors are various absorptive and dissipative losses in the transmission media.

To address these performance issues, high end digital sampling oscilloscopes of different designs or model numbers have been characterized to discover a particular digital signal processing (DSP) transform, which, for that particular model oscilloscope flattens its frequency response. A more expensive approach is to individually characterize each instrument produced, and then provide it with its own custom compensatory DSP transform. In either case, the DSP techniques used in the transforms are capable of correcting each of the error mechanisms mentioned above, singly and in combination. However, they impose requirements on the manner in which an acquisition record was produced. One such requirement is that all samples in the acquisition record should have equal spacing along a time axis due to the fact that viable DSP techniques typically require regularly spaced samples.

Obtaining samples that are equally spaced in time can be obtained fairly easily for a real time digital sampling oscilloscope, at least for a single acquisition record. So long as there is just one acquisition record contributing to a trace, the acquisition record is compensated by DSP and the result given to the rendering system for display according to the user's settings. Traces requiring higher bandwidths require more samples per second with associated greater memory for storage of the digitized samples and resultant economic penalty.

An alternative and for some situations more economically viable approach for repetitive waveforms is to use an equivalent time (ET) digital sampling oscilloscope. An equivalent time digital sampling oscilloscope takes, for a first trigger, a set of samples of a first portion of the input waveform, and then for a subsequent trigger another set of samples for a second (different) portion of the waveform (by a judicious application of a selected delay after the subsequent trigger), and so on, until we have a collection of acquisition records (one record per sample set) that, when taken in the proper sequence, describe the measured waveform of interest.

In its simplest form, equivalent time is simply combining data from multiple acquisitions. However, there are two traditional types of equivalent time oscilloscopes. The first traditional method is typically used on very high bandwidth sampling oscilloscopes in the many 10s of GHz of bandwidth. This method uses sequential sampling. It waits for a trigger, delays a programmable amount of time after the trigger, then takes a sample. Often, multiple samples are taken at a fixed spacing from the first, but the sample spacing is very wide relative to a real time scope. Most of the time these additional samples aren't even used as the time window wasn't wide enough. On the next trigger, the delay is programmed a little longer, and so on, so that a waveform usually builds from left to right, one sample per trigger. This method provides very little, if any, negative time. The second traditional method uses random sampling. This method samples at a programmable frequency, which is fixed during an acquisition, so that all samples are equally spaced. The time from the trigger to the sample clock is measured to determine how the samples will map to the display. The trigger also initiates the sequence that stops the sampling after a pre-determined amount of time. This time determines how much positive time is available. Depending upon the sample rate and the desired time window, one or more equally spaced samples may add to the equivalent time record. In order to cover larger time windows, the sample rate is slowed down. Data from each trigger covers the entire display, but the data is sparse. Multiple acquisitions eventually fill in the display. This method is referred to as random sampling because the positions of the samples are random (but within one sample period) with respect to the trigger, and this time must be measured.

Note that equivalent time techniques are not applicable to single shot traces due to the necessity of multiple triggers. Also note that not all samples will have originated on the same part of the time axis that will be used to display the trace.

Merging the various sets of samples and at the same time maintaining equal spacing of the samples is in a practical sense impossible. Within each of the several acquisition records the samples will be equally spaced in time, but the acquisition records as entities have, (despite the judicious known, after-trigger delays) essentially arbitrary amounts of time between when one ends and the next one starts. (Even if corrections are made for the time used to await a next trigger and the subsequent delay to position the upcoming acquisition record at the place in the incoming waveform that is where the next segment of samples is to occur, an arbitrary amount of time which is less than one sample period still remains.) Thus, one cannot simply merge all the samples into one big acquisition record for compensation by DSP techniques.

Additional effects, such as trigger jitter, also mitigate against attempts at such a merger of individual acquisition records. First, there is trigger jitter. Even if the input signal were quite stable and exhibited excellent repeatability (i.e., after a trigger the locations of successive events along the waveform of interest are always the same as they were for a previous trigger), the oscilloscope is not equipped with the ability to resume a sequence of samples with exactly the same delay after the next trigger as there was for the previous trigger. The timing of the samples is driven by a stable, yet free running, oscillator whose phase cannot be reset at will while it is running. This is a significant effect, since the time base of the oscilloscope and that of the system under test have no obligation to be related to each other. In addition, the waveform of interest may not have good periodicity, anyway. So the samples might not line up, no matter what we do, when some samples are taken from one instance of the signal and others from other instances.

SUMMARY

In representative embodiments, a method of data acquisition for a digital instrument having a bandwidth is disclosed herein. The method includes receiving a signal and associated trigger. Using that trigger, a plurality of signal values is sampled at multiple time intervals to create an acquisition record representing a continuous fractional segment of the signal. The plurality of samples meets the Nyquist requirement for the bandwidth but is in error according to at least one known error mechanism. The acquisition record is then processed with DSP techniques to produce a compensated acquisition record corrected for the at least one known error mechanism. Each associated compensated acquisition record is incorporated into a result acquisition record as a segment thereof corresponding to a continuous fractional segment of the signal whose signal values were sampled in an associated instance. An additional signal and additional associated trigger are received. The above steps are then repeated for the additional signal and additional associated trigger.

Other aspects and advantages will become apparent from the following detailed description, taken in conjunction with the accompanying drawings, illustrating by way of example various principles of representative embodiments.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements.

DETAILED DESCRIPTION

Figure 1:
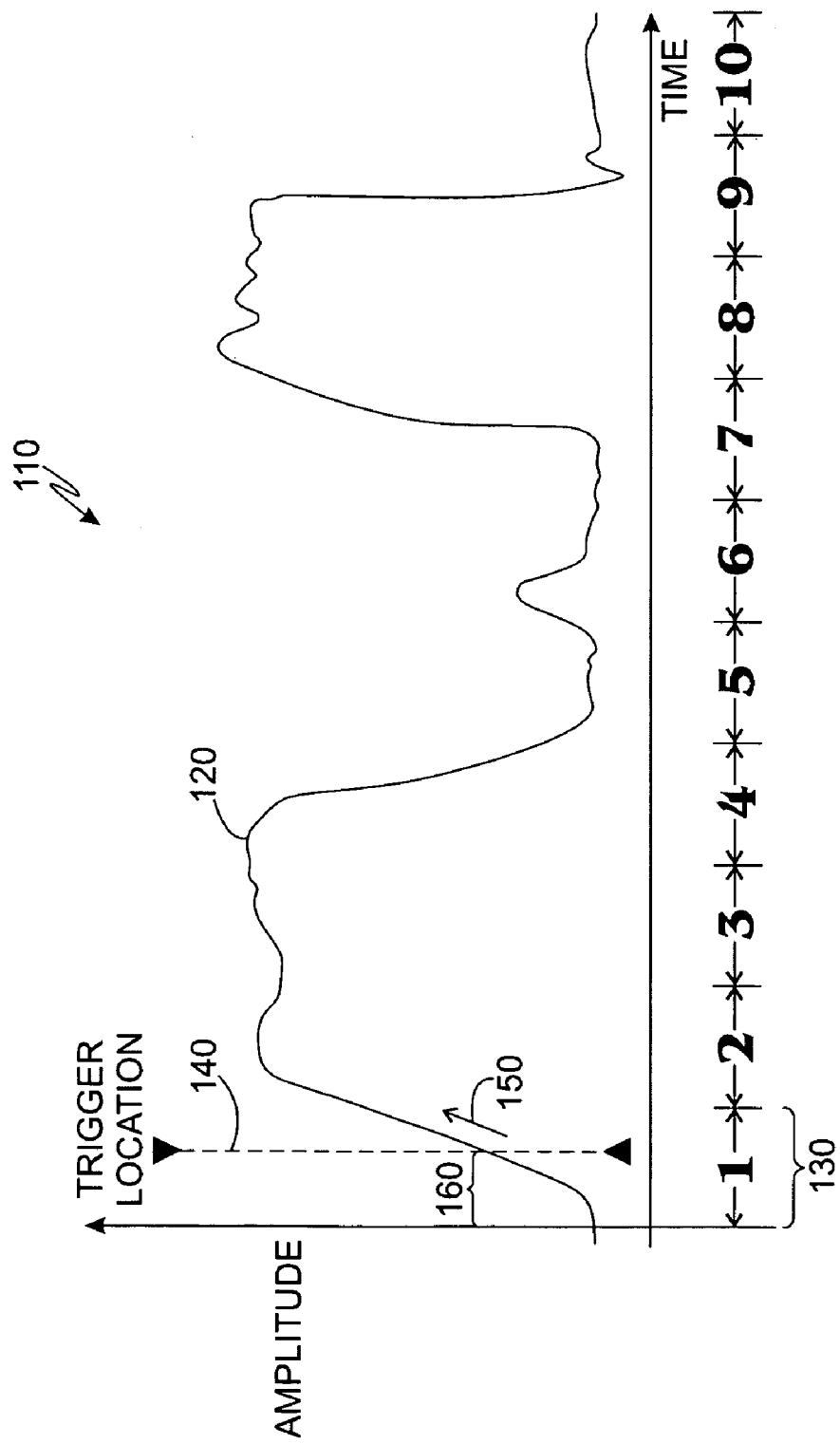
FIG. 1 is a diagram illustrating one way a waveform can be acquired by a digital oscilloscope operating consistent with the principles of the invention and incorporating digital signal processing to compensate for frequency related amplitude errors in its response.

FIG. 1 is a diagram 110 illustrating one way a waveform 120 can be acquired by a digital oscilloscope operating consistent with the principles of the invention and incorporating digital signal processing (DSP) to compensate for frequency related amplitude errors in its response. The diagram 110 of FIG. 1 illustrates the equivalent time acquisition of the waveform 120 that is of a length that is a multiple of what can be acquired as equally spaced samples sequentially stored in one acquisition record by the acquisition hardware. The waveform 120 is shown against a Y amplitude (voltage) axis and an X time axis, as is the usual case. However, note the ten indicated time segments 1,2,3, 4,5,6,7,8,9,10 below the time axis, of which the first of the time segments 1 is referred to herein as first time segment 130, also referred to herein as first segment 130, is one instance of interest. It will be appreciated that the number of such time segments present will vary depending upon the needs of the individual measurement situation. One reasonable range for the number of such segments is from ten to one hundred, while in principle it is actually from one to however many are needed and can be afforded.

During each of the segments the data acquisition hardware of the oscilloscope takes some number of consecutive, and equally spaced in time, samples that are digitized and placed into an acquisition record. It is quite possibly, though not necessarily, the case that these samples are taken at a maximum rate and spaced as close together in time as possible. In current practice, it is common for a high end oscilloscope to have acquisition records of a million or so consecutive samples.

In FIG. 1, a trigger event has been detected by a separate (and conventional) hardware implemented trigger circuit (not shown), and a TRIGGER LOCATION 140 is indicated on the diagram as being within the first segment 130. The trigger event is also referred to herein as the trigger. This example corresponds to triggering on the rising edge 150 of the input waveform 120, with an amount of "negative time" 160 appearing in the trace to the left of the indicated TRIGGER LOCATION 140. This situation is created by continuing the production of the acquisition record for some selected amount of time after the trigger event. The less amount of time selected after the trigger event, the more negative time shows what transpired before the trigger, up to the size of the acquisition record.

To create an oscillographic trace 120 of this sort, not only should the acquisition record for the first segment 130 be acquired, but also the acquisition records for the second, third, etc., for as many segments as needed. The number of segments needed is determined by the time span of the desired equivalent time record divided by the time span of the acquisition record. Likewise, the operator can specify a sample rate, which might be lower than the maximum rate the oscilloscope can perform. As a related example, the operator might instruct the oscilloscope to sample at 20 Giga-samples/second (GSa/sec) with the intent of being able to create a displayable trace representing five hundred microseconds of data. So, we will want to obtain a total of 10 million samples (assuming no overlap). If there were one million locations per acquisition record, ten segments would be needed and each acquisition record would span fifty microseconds.

It is not generally that simple, although the idea is valid in principle. First, in a digital architecture with memory locations addressed by binary, octal or hexadecimal quantities, the one million locations is, for practical purposes, probably not $10^6$, but more likely to be $2^{20}$. Next, the DSP that will accomplish the compensation is related to filtering, and it needs to be started well before it provides valid results, so the spans of the various acquisition records need to overlap. The amount of overlap depends upon the DSP mechanism, and might be, for example, on the order of about one hundred samples. The issue of overlap will be more clearly visible in FIG. 2. Prior to considering overlap, however, note that what is intended here is to apply DSP correction to each acquisition record produced in connection with a measurement made in accordance with the scheme illustrated in FIG. 1. The corrected results are a collection of compensated acquisition records which are merged into one large equivalent time record that can be given to the rendering process. Since the acquisition records are taken, in the 20 GSa/sec example of FIG. 1, at successive locations which are each another fifty microseconds further along the time axis, with the location of the first being determined by a selected relation to the TRIGGER LOCATION 140, there is a supervisory timing mechanism that extracts a second, third, etc., acquisition record starting fifty, one hundred, etc., microseconds after successive instances of the trigger event, as modified by the TRIGGER LOCATION 140 offset in use. This timing mechanism is not shown in FIG. 1. Prior art equivalent time digital sampling oscilloscopes (DSOs) permit the location of individual samples to drift across a repetitive waveform to fill in the samples within an equivalent time record. Even real time digital sampling oscilloscopes have the ability to locate a solitary acquisition record an arbitrary amount of time after an earlier trigger event. Here, however, that same general mechanism is used to take not one sample, but to locate an entire sequence of samples which are equally spaced relative to other such sequences. It is stressed again that the individual acquisition records are compensated by DSP processing before they are merged into one collection used by the rendering mechanism to create the displayed trace.

Figure 2:
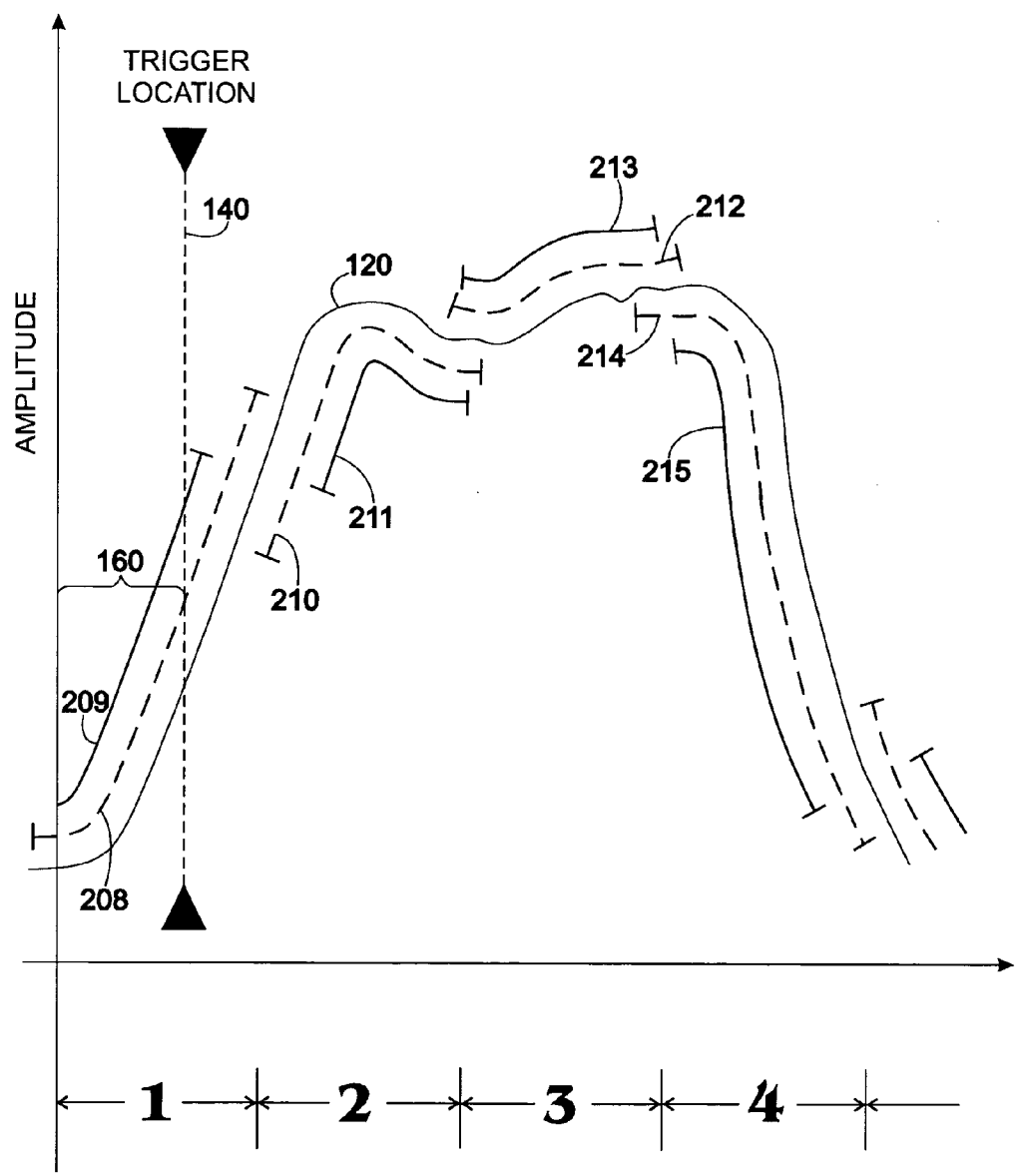
FIG. 2 is an expansion of an initial portion of the diagram of FIG. 1.

FIG. 2 is an expansion of an initial portion of the diagram of FIG. 1. FIG. 2 illustrates additional properties of the oscilloscope's operation. Of interest in this figure are the dashed heavy lines 208,210,212,214 that are shown adjacent respectively to and offset respectively from the first, second, third, and fourth time segments 1,2,3,4 identified in FIG. 1 of the waveform 120 and the solid heavy lines 209,211,213, 215 that are also shown adjacent respectively to and offset respectively from the first, second, third, and fourth time segments 1,2,3,4 again as identified in FIG. 1. The numbers of these segments 1,2,3,4 are also shown along the horizontal time axis of FIG. 2. The dashed heavy lines 208,210, 212,214 represent the portion of the input waveform 120 that is actually sampled by the sampling hardware for their respective segments and that is sent to the DSP processing mechanism.

If that DSP mechanism is an N tap long FIR (Finite Impulse Response) filter and K samples are being processed, then the result is R=K−(N−1) values in length. Said another way, if R samples are required for rendering, then the acquisition process must acquire K=R+(N−1) samples. The number of samples available for the rendering of the first segment 130, as well for all the other segments, should be R. Hence, the dashed line 208 for the first segment 130 overlaps the dashed line 210 for the second segment, which is in turn overlaps the dashed line 212, which overlaps the dashed line 214, and so on.

The heavy dashed lines 208,210,212,214 represent the sampled consecutive raw electrical values that are $\Delta T$ (a sample period) apart, and that are the K-many values input to the DSP process. The solid heavy lines 209,211,213,215 represent the R-many DSP result values that are also equally spaced (by that same $\Delta T$) among themselves, even though the compensated first sample in, say, the third segment (solid heavy line 213) is not necessarily $\Delta T$ after the last compensated sample in the second segment (solid heavy line 211). Recall the discussion in the background regarding not being able to reset the phase of the free running oscillator that times the taking of the samples. The heavy solid lines 209,211,213,215 do not overlap. While in FIG. 2 the heavy solid lines 209,211,213,215 are shown offset from the input waveform 120, this is for illustrative purposes only. The heavy solid lines 209,211,213,215 are each the respective segments of the input waveform 120, wherein a line between the end of the heavy solid line associated with one time segment and the beginning of the heavy solid line associated with the next time segment intersects the input waveform 120,as drawn on FIG. 2, at the time separating the two time segments. As noted before, the rendering mechanism is not disturbed by the arbitrary spacing $\delta$ between segments ($0 \leq \delta \leq \Delta T$), just as long as it receives a valid sequence of (time, voltage) pairs.

In the example shown in FIG. 2 the ten segments are acquired in order, from left to right. This is not a requirement, even though it is often a useful way to proceed. Once it is known how many segments are to be acquired as will be specified by the user or at least determined from other things that the user does specify, an order for those segments can be decided upon. That order might be, as in FIGS. 1 and 2, a strictly adjacent and consecutive one. On the other hand, it might be a random one. Suppose that instead of ten segments there were one hundred. Furthermore, it may take some time for all one hundred triggers to occur. If we let the oscilloscope display the frame buffer content as it is accumulated during the time required for the one hundred triggers, the trace will be observed to "emerge" as it is acquired. If the order of the segments is strictly left-to-right, then the trace would start at the left and grow to the right. If, on the other hand, the order is random (or seemingly so), then the trace will appear to "fill-in all over" as time passes. It could well be the case that some characteristic of the trace that is of interest is ruled out by the time the trace is 20% filled in using a random or other sequence of segments method, allowing the measurement to be aborted in favor of some other activity. With a linear sequence for the segments, however, the time to reach such a decision might take much longer.

Figure 3:
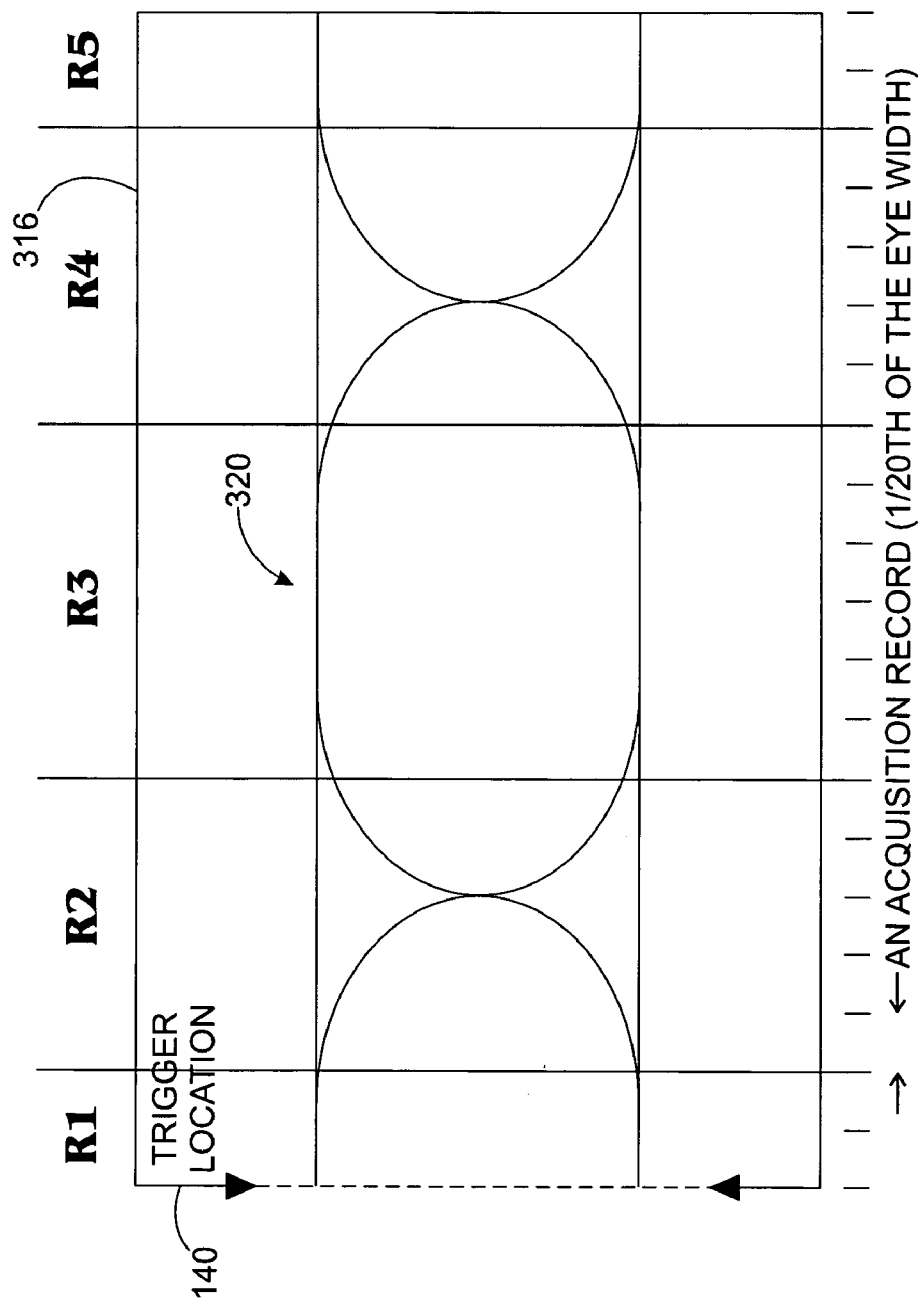
FIG. 3 is a diagram illustrating the manner in which the principles of FIG. 1 can be used to create a multi-valued waveform.

FIG. 3 is another diagram 316 illustrating the manner in which the principles of FIG. 1 can be used to display a multi-valued waveform 320. In particular, the multi-valued waveform 320 of FIG. 3 is an eye-diagram 316. In practice, the signal traces of FIG. 3 would be captured and displayed multiple times and in multiple segments (FIG. 3 indicates 20 segments). Further, the multiple signal traces would not exactly overlap each other but would instead be displaced both vertically and horizontally by varying amounts at varying places reflecting differences due to trigger jitter, etc. For ease of illustration, only one signal trace is shown in FIG. 3. An eye-diagram 316 is a primary tool in the analysis of serial communication streams. In serial communications a clock signal is normally embedded in the data stream, and the receiver will recover the clock signal as it receives the data stream. For an eye-diagram 316, the system triggers on that clock signal, but analyzes the data stream. So, on one trace the part of the data stream analyzed may be on the rising edge. On another trace, the part of the data stream analyzed maybe on the falling edge. On other traces, solid ones or zeros maybe received. Eventually the display fills in and looks like an eye. Typically this is displayed such that on the left side of the screen there is a short section that is not analyzed where either all 1's or all 0's are displayed. Both of these patterns will be observed. Acquired segments in region R1 are in this category. Then there is a region of data at the beginning of the bit period that is being analyzed. In that region, which comprises several traces the 1's and 0's continue, but there are also falling bit edges and rising bit edges. Acquired segments in region R2 are in this category. Then there is a region that should show stable 1's and 0's. Acquired segments in region R3 are in this category. At the far right there are two other transition regions comprising first rising and falling edges and stable 1's and 0's (acquired segments in region R4) and then a region of solid 1's and 0's (acquired segments in region R5). The middle region is the area interest. This region provides an indication of the margin available in capturing the data. If this region is not very wide, it indicates that there is not a lot of time to capture the data. If this region is not very high, it indicates that voltage references used to capture the data must be more precise. An analysis of the eye-diagram can be used to obtain an expected error rate. In FIG. 3, it is assumed that an external trigger is provided by a clock signal, and that the oscilloscope has been instructed to randomize or otherwise set the order in which the twenty segments of the example of FIG. 3 are obtained. After a sufficient number of complete "sweeps," and relying on known mechanisms for displaying multi-valued waveforms, the result is a high definition eye-diagram that emerges more or less uniformly. Typically segment boundaries will be shifted from sweep to sweep so as to remove or reduce any anomalies that might show up at these boundaries.

Figure 4:
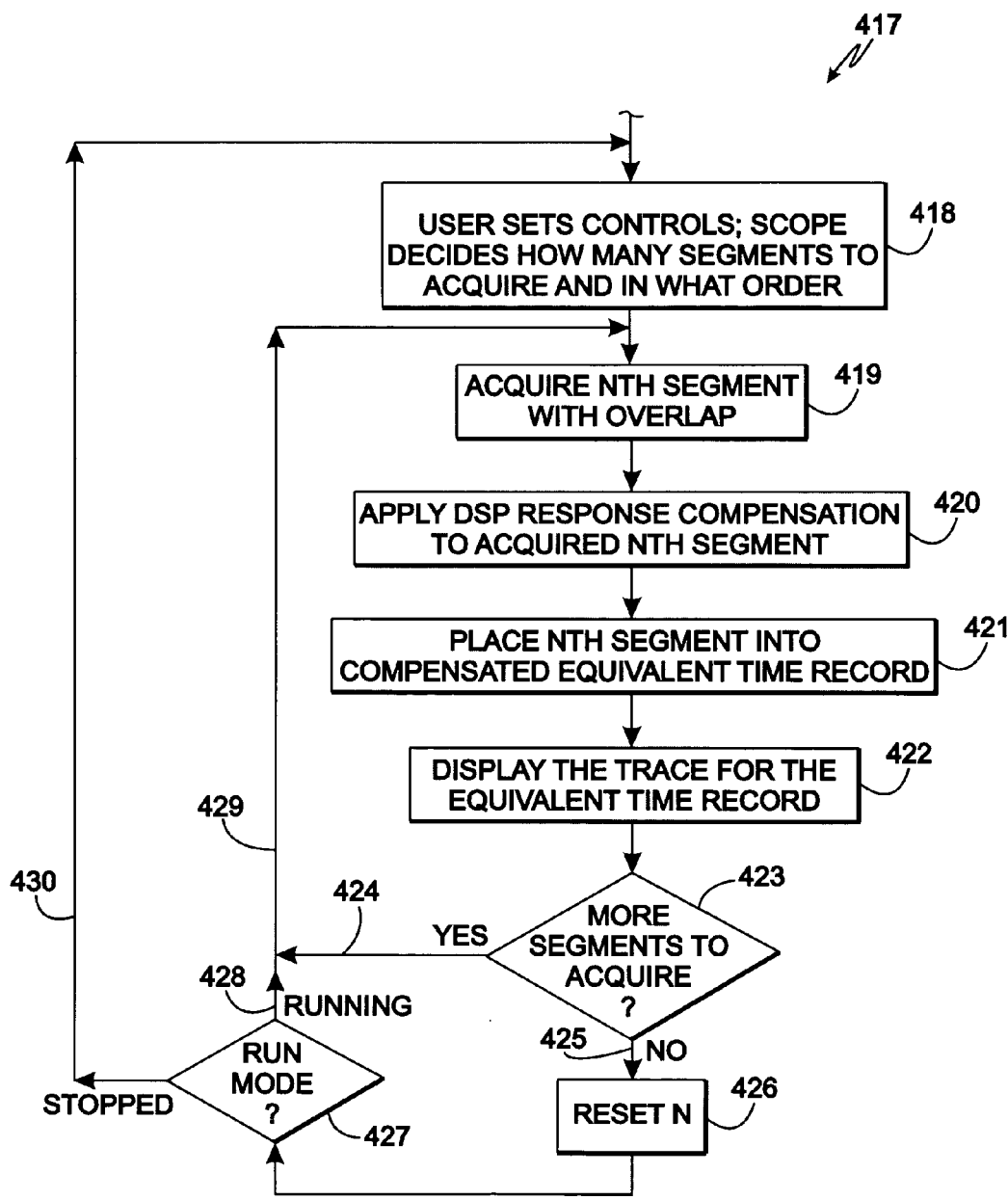
FIG. 4 is a simplified flowchart of the operation of an equivalent time digital oscilloscope incorporating digital signal processing to compensate for frequency related amplitude errors in its response.

FIG. 4 is a simplified flowchart 417 of a method for incorporating DSP to compensate for frequency related amplitude errors in the response of a system. In particular, and as an example, the flowchart 417 describes the method of creating a compensated equivalent time record from a collection of acquisition records for the input waveform 120 for an oscilloscope. As the first step 418 in this method, the user sets the controls of the system (i.e., the oscilloscope) so as to produce a result similar to that of FIG. 1 or FIG. 3. That is, the operator has at his disposal a compensated trace that is longer than it could be if it were limited to the normal acquisition record that the hardware can obtain. From the description of sample rate and trace length the logic of the oscilloscope determines how many segments to acquire and in what order those segments are to be acquired. Not shown in the flowchart, but presumably present, is an instruction to initiate the process, i.e., a RUN command once the oscilloscope has been appropriately configured.

Once the oscilloscope is running, in the next step 419 an acquisition record is acquired. That is, the first, second or next acquisition record is acquired with overlap. The ordinal description of the record determines how long after the next TRIGGER the system waits to specify that the incoming sample is a part of that segment. The "overlap" means that longer records (of K-many values) will be produced from which can be derived the R-many values that will form the collection of DSP-compensated values. Step 419 is followed immediately by step 420, in which the acquisition record obtained in step 419 is processed by the DSP mechanism and the R-many result values are produced. In step 421 those R-many result values (which are a compensated, if shorter, acquisition record) are placed into their corresponding location within the waiting equivalent time acquisition record. That equivalent time acquisition record is an input to the rendering process (which is also informed by the user about which part of the overall acquired waveform to show in the display, print to a printer, etc.). Accordingly, step 422 displays the trace. It will be appreciated that other actions besides, or instead of, displaying might be performed. Step 422 amounts to: "The result gets used." That might, however, be only the "result so far" since all the segments might not yet have been acquired. Thus, a qualifier 423 asks if there are more segments to acquire, and if there are, a path 424 leads to path 429 that returns to step 419, where the next segment in the desired sequence is obtained.

Otherwise, the entire collection of segments has been acquired, and path 425 leads to step 426 that resets whatever internal indices guide the loop of steps 419–423, in anticipation of the loop starting over. Such action depends upon whether or not the oscilloscope is still running, as determined by qualifier 427. In practice, certain control changes, such as in block 418, can interrupt the flow of the process at many points, leading back to block 418. The position of block 427 is just one of these points. If the oscilloscope is still in the RUN mode, path 428 leads to path 429, where the loop of steps 419–423 is repeated. Otherwise, the oscilloscope has been stopped, and path 430 leads back to step 418, where another measurement activity can be specified and initiated. Presumably, absent instructions to the contrary, the display would continue to show the results of the most recent measurement.

Finally, it will be appreciated that although the examples described above all have acquisition records that are of the same length, it is possible for them to have different lengths. They might all have the same length, or, their lengths might not be equal to one another during the same set of measurements to produce a trace. This variation does not represent a problem for the operation of the method that has been described above.

It will also be appreciated that the compensated acquisition records need not form a true partition of the equivalent time record that they create when they are merged. That is, they might well overlap, either partially or completely, and in doing so might produce X (time) locations that have multiple Y (voltage) values. Overlap may also produce an equivalent time record whose X-axis spacing is more dense than the maximum sample rate, as is often the case in equivalent time sampling. These would not interfere with the rendering process. But the DSP compensation process, if applied to the merged original acquisition records would face not only unequal spacing in time, but multiple values. That is a difficult combination for DSP. However, by performing the DSP compensation before the merging, the multi-valued problem and the unequal spacing problem are avoided (at the time of data capture the spacing in time is uniform and the true signal has only one value at a given instant). The present approach eases the production of eye diagrams, which by their nature are multi-valued.

Another possibility is that the DSP mechanism may include interpolation (or decimation), resulting in more dense (or less dense) sample spacing in the processed record that is merged into the equivalent time record.

Figure 5:
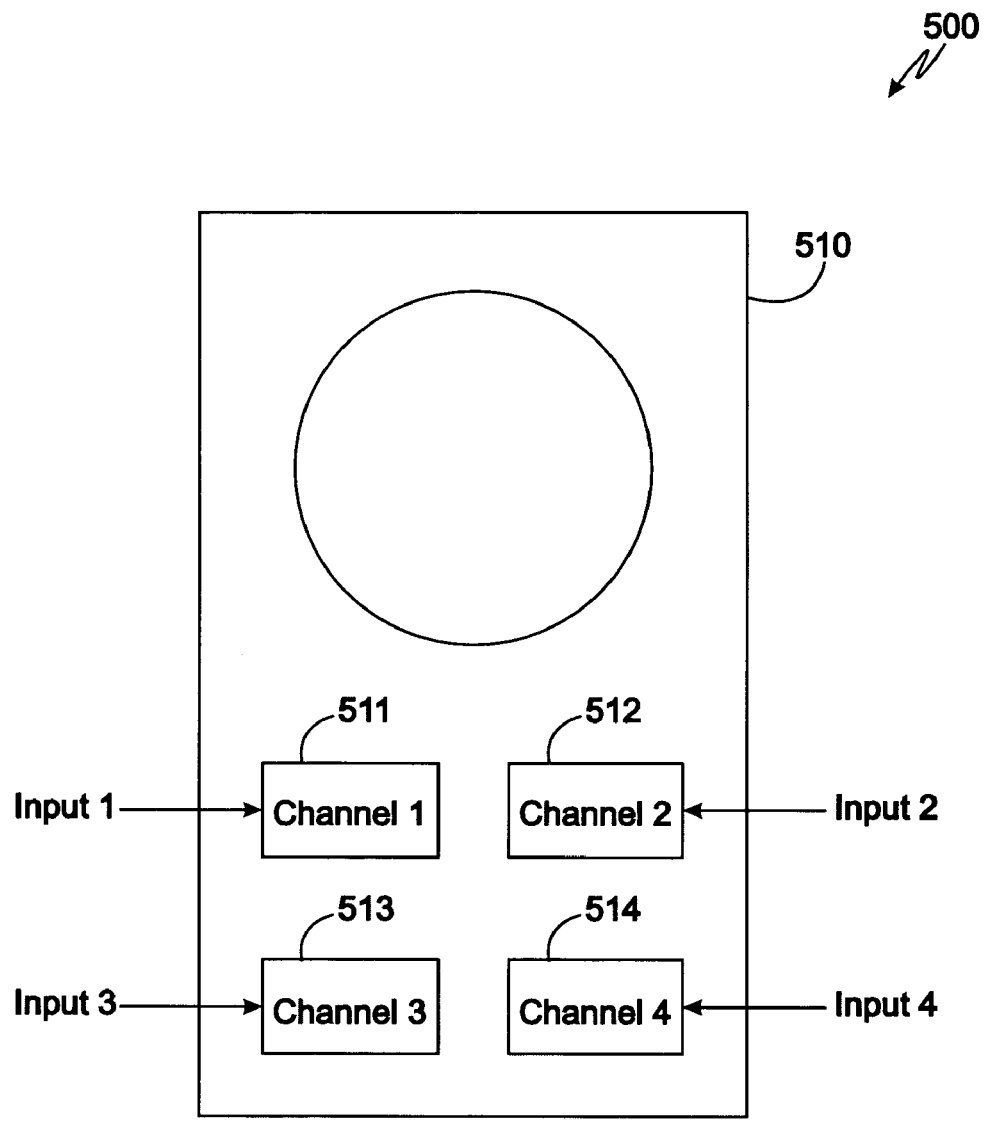
FIG. 5 is a drawing of a system for receiving and processing waveforms.

FIG. 5 is a drawing of a system 500 for receiving and processing waveforms 120,320. In FIG. 5, a digital oscilloscope 510 is shown that has four channels (channel 1, channel 2, channel 3, and channel 4) on which it is capable of receiving waveforms and on which waveforms the oscilloscope 510 is capable of performing DSP processing. In alternate mode, if an analogue oscilloscope had four input channels, it would draw the waveform on each input channel alternately. The analogue oscilloscope would complete the rendering of the waveform on the first channel following a trigger, on the next trigger it would complete the rendering of the waveform on the second channel, then on the next trigger it would complete the rendering of the waveform on the third channel, and finally on the fourth trigger it would complete the rendering of the waveform on the fourth channel. Due to system-dependent issues such as hardware settling time, in the alternate equivalent time mode it is often preferred to acquire records from several triggers before switching from one channel to another, or instead of allowing a specified number of triggers to occur before switching channels, the system may wait a certain period of time before channel switching. An analogous operation is also available on some digital oscilloscopes 510 but only on digital oscilloscopes 510 in which a given analogue to digital converter (a digitizer) services multiple input channels.

Figure 6:
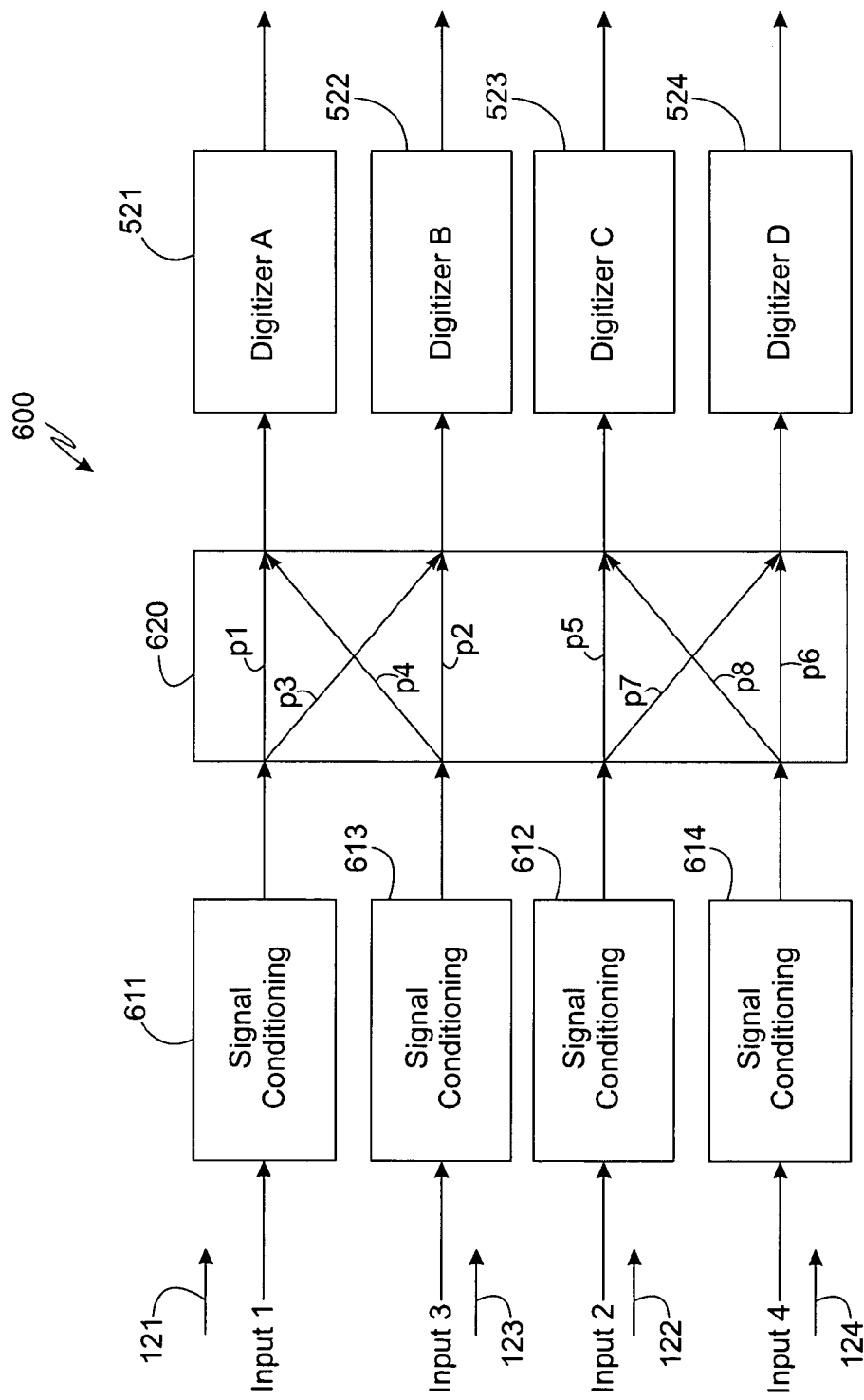
FIG. 6 is a block diagram of an acquisition portion of a digitizing oscilloscope.

FIG. 6 is a block diagram of an acquisition portion 600 of a digitizing oscilloscope 510. Signal conditioning modules 611, 612, 613, 614 typically include an attenuator and an amplifier, each with programmable attenuation/gain settings. A multiplexer 620 permits different inputs to be sampled at different maximum rates. For example, if paths P1 and P2 are followed, inputs 1 and 3 are sampled at 10 GSa/sec. However, by following paths P1 and P3 instead, input 1 can be sampled at 20 GSa/sec at the expense of not sampling input 3. In an alternate mode at 20 GSa/sec, paths P1 and P3 are used for the first trigger to sample input 1 at 20 GSa/sec and then paths P2 and P4 are used for the next trigger to sample input 3 at 20 GSa/sec.

In the following representative example, it is assumed that each of the digitizers 521,522,523,524 is such that a sample of an input waveform at a rate of 10 GSa/sec can be supported and that the input channels support frequencies up to 6 GHz at which we want to compensate gain and phase. The Nyquist limitation requires a sampling rate of 12 GSa/sec to accurately compensate and represent an input waveform, which is not available on any of the individual digitizers 521,522,523,524. Applying a first input waveform 121 to one of the channels, channel 1 at input 1 for example, two of the digitizers, say for example digitizer A 521 and digitizer B 522, can be configured using paths P1 and P3 to acquire sampling records of the first input waveform 121 as described above with respect to FIGS. 1–4 to provide the capability of acquiring the first input waveform 121 at a sampling rate of 20 GSa/sec which is above the Nyquist limitation. Once acquired the 20 GSa/sec record obtained by interleaving the 10 GSa/sec records from digitizer A 521 and digitizer B 522 is compensated digitally and then placed in the correct order into an acquisition record for possible rendering of the compensated waveform on the oscilloscope 510 or for other current/future use. Note that if the oscilloscope 510 is also configured to function effectively as one digitizer at 40 GSa/sec (via more switches in the multiplexer to allow their access for the first input waveform 121), this higher sample rate could be used in acquiring the first input waveform 121 at that higher sampling rate.

Should there also be a second input waveform 122 of which it is also desired to compensate, the second input waveform 122 could be applied to channel 2 at input 2, for example, to the other two digitizers (digitizer C 523 and digitizer D 524), which digitizers have also been configured to acquire sampling records of the second input waveform 122 as described above with respect to FIGS. 1–4 via paths P5 and P7 for example. This configuration again provides the capability of acquiring the waveform at a sampling rate of 20 GSa/sec. Sampling of the second input waveform 122 is initiated by the same trigger as is used for sampling of the first input waveform 121. Once acquired the 20 GSa/sec record obtained from interleaving the records from digitizer C 523 and digitizer D 524 are compensated digitally and then placed in the correct order into an acquisition record for possible rendering of the compensated waveform on the oscilloscope 510 or for other current/future use.

At this point, alternate mode is not required. The oscilloscope is operating in a form of multiplexing wherein the scope operates as either 4 digitizers at 10 GSa/sec or as 2 digitizers at 20 GSa/sec. Alternate mode is required when 3 or 4 inputs, each acquired at 20 GSa/sec, are viewed.

Should there also be a third input waveform 123 of which it is also desired to compensate, the third input waveform 123 could be applied, for example, to channel 3 at input three to one pair of digitizers, for example digitizer A 521 and digitizer B 522 via paths P2 and P4 in order to acquire and compensate the third input waveform 123 as described above for the first input waveform 121 but on an alternate trigger.

In addition, should there also be a fourth input waveform 124 of which it is also desired to compensate, the fourth input waveform 124 could be applied, for example, to channel 4 at input four to the other pair of digitizers, digitizer C 523 and digitizer D 524, via paths P6 and P8 in order to acquire and compensate the fourth input waveform 124 as described above for the second input waveform 122 but on the alternate trigger used to acquire the second input waveform 122.

The mode of operation just described for the first, second, third, and fourth input waveforms 121,122,123,124 is referred to herein as an alternate real-time mode. This alternate real-time mode is not a true real-time mode in that all input signals are not acquired with a single trigger. Nonetheless, each waveform acquired on a single trigger is a complete, compensated representation of the associated input signal. As such, the alternate real-time mode could also be referred to as pseudo-real time mode. So, in a real sense it is real-time and is useful for a large number of applications, and except for the lack of simultaneous capture of all signals, has all the advantages of a true real-time mode.

In another mode, each acquired sample from the various input waveforms can be processed digitally to compensate it for gain/phase and then inserted (or averaged, etc.) into its associated equivalent time record. At slower sweep speeds, the full-sample rate data might not cover the full time-window of the equivalent time record. In such case, the corrected waveform samples can be inserted into the correct position of the equivalent time record. Then the hardware parameters (such as post-trigger delay) are modified so that the next acquisition covers a different portion of the equivalent time record. This sequence can be repeated as desired until all of the equivalent time records are filled in with data or another need is met.

While the present invention has been described in detail in relation to representative embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. A method of data acquisition from a signal by a digital instrument having a bandwidth, comprising:
    (a) receiving a signal and associated trigger;
    (b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;
    (c) subsequent to step (b), processing acquisition record with DSP techniques to produce compensated acquisition record corrected for the at least one known error mechanism;
    (d) repeating sequenced pairs steps (b) and (c) for a different continuous fractional segment of the signal at least once;
    (e) subsequent each instance of step (d), incorporating associated compensated acquisition record into resultant acquisition record as segment thereof corresponding to continuous fractional segment of signal whose signal values were sampled in associated instance of step (b);
    (f) receiving additional signal and additional associated trigger; and
    repeating steps (b) thru (e) for additional signal and additional associated trigger.

2. A method as in claim 1, further comprising the step of: displaying the data comprising at least one compensated acquisition record.

3. A method of data acquisition from a signal by a digital instrument having a bandwidth, comprising:
    (a) receiving a signal and associated trigger;
    (b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;
    (c) subsequent to step (b), processing acquisition record with DSP techniques to produce compensated acquisition record corrected for the at least one known error mechanism;
    (d) repeating sequenced pairs steps (b) and (c) at least one time;
    (e) subsequent each instance of step (d), incorporating associated compensated acquisition record into resultant acquisition record as segment thereof corresponding to continuous fractional segment of signal whose signal values were sampled in associated instance of step (b);
    (f) receiving additional signal and additional associated trigger, wherein the acquisition records of step (b) and the compensated acquisition records of step (c) are consecutive and adjacent continuous fractional segments of the resultant acquisition record of step (e); and
    repeating steps (b) thru (e) for additional signal and additional associated trigger.

4. A method of data acquisition from a signal by a digital instrument having a bandwidth, comprising:
    (a) receiving a signal and associated trigger;
    (b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;
    (c) subsequent to step (b), processing acquisition record with DSP techniques to produce compensated acquisition record corrected for the at least one known error mechanism;
    (d) repeating sequenced pairs steps (b) and (c) at least one time;
    (e) subsequent each instance of step (d), incorporating associated compensated acquisition record into resultant acquisition record as segment thereof corresponding to continuous fractional segment of signal whose signal values were sampled in associated instance of step (b);
    (f) receiving additional signal and additional associated trigger, wherein the acquisition records of step (b) and the compensated acquisition records of step (c) are non-adjacent continuous fractional segments of the resultant acquisition record of step (e); and
    repeating steps (b) thru (e) for additional signal and additional associated trigger.

5. A method of data acquisition from a signal by a digital instrument having a bandwidth, comprising:
    (a) receiving a signal and associated trigger;

(b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger and overlapping the span of the acquisition records of step (b) such that the ending portion of one compensated acquisition record corresponds to a beginning portion of another;

(c) subsequent to step (b), processing acquisition record with DSP techniques to produce compensated acquisition record corrected for the at least one known error mechanism;

(d) repeating sequenced pairs steps (b) and (c) at least one time;

(e) subsequent each instance of step (d), incorporating associated compensated acquisition record into resultant acquisition record as segment thereof corresponding to continuous fractional segment of signal whose signal values were sampled in associated instance of step (b);

(f) receiving additional signal and additional associated trigger; and repeating steps (b) thru (e) for additional signal and additional associated trigger.

6. A method as in claim 1, wherein the spans of the acquisition records of step (b) are different from one another.

7. A method as in claim 1, wherein the digital instrument is a digital oscillographic instrument.

8. A method of data acquisition from a signal by a digital instrument having a bandwidth, comprising:

(a) receiving a signal and associated trigger;

(b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;

(c) subsequent to step (b), processing acquisition record with DSP techniques to produce compensated acquisition record corrected for the at least one known error mechanism;

(d) repeating sequenced pairs steps (b) and (c) at least one time;

(e) subsequent each instance of step (d), incorporating associated compensated acquisition record into resultant acquisition record as segment thereof corresponding to continuous fractional segment of signal whose signal values were sampled in associated instance of step (b);

(f) receiving additional signal and additional associated trigger;

repeating steps (b) thru (e) for additional signal and additional associated trigger;

receiving a second additional signal and a second additional associated trigger, wherein the second additional associated trigger is the same as the additional associated trigger; and repeating steps (b) thru (e) for the second additional signal.

9. A computer readable memory device embodying a computer program of instructions executable by the computer for data acquisition from a signal by a digital instrument having a bandwidth, the instructions comprising:

(a) receiving a signal and associated trigger;

(b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;

(c) subsequent to step (b), processing acquisition record with DSP techniques to produce compensated acquisition record corrected for the at least one known error mechanism;

(d) repeating sequenced pairs steps (b) and (c) for a different continuous fractional segment of the signal at least once;

(e) subsequent each instance of step (d), incorporating associated compensated acquisition record into resultant acquisition record as segment thereof corresponding to continuous fractional segment of signal whose signal values were sampled in associated instance of step (b);

(f) receiving additional signal and additional associated trigger; and repeating steps (b) thru (e) for additional signal and additional associated trigger.

10. The computer readable memory device as recited in claim 9, further comprising:

displaying the data comprising at least one compensated acquisition record.

11. A computer readable memory device embodying a computer program of instructions executable by the computer for data acquisition from a signal by a digital instrument having a bandwidth, the instructions comprising:

(a) receiving a signal and associated trigger;

(b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;

(c) subsequent to step (b), processing acquisition record with DSP techniques to produce compensated acquisition record corrected for the at least one known error mechanism;

(d) repeating sequenced pairs steps (b) and (c) at least one time;

(e) subsequent each instance of step (d), incorporating associated compensated acquisition record into resultant acquisition record as segment thereof corresponding to continuous fractional segment of signal whose signal values were sampled in associated instance of step (b);

(f) receiving additional signal and additional associated trigger, wherein the acquisition records of step (b) and the compensated acquisition records of step (c) are consecutive and adjacent continuous fractional segments of the resultant acquisition record of step (e); and repeating steps (b) thru (e) for additional signal and additional associated trigger.

12. A computer readable memory device embodying a computer program of instructions executable by the computer for data acquisition from a signal by a digital instrument having a bandwidth, the instructions comprising:
  (a) receiving a signal and associated trigger;
  (b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;
  (c) subsequent to step (b), processing acquisition record with DSP techniques to produce compensated acquisition record corrected for the at least one known error mechanism;
  (d) repeating sequenced pairs steps (b) and (c) at least one time;
  (e) subsequent each instance of step (d), incorporating associated compensated acquisition record into resultant acquisition record as segment thereof corresponding to continuous fractional segment of signal whose signal values were sampled in associated instance of step (b);
  (f) receiving additional signal and additional associated trigger, wherein the acquisition records of step (b) and the compensated acquisition records of step (c) are non-adjacent continuous fractional segments of the resultant acquisition record of step (e); and
    repeating steps (b) thru (e) for additional signal and additional associated trigger.

13. A computer readable memory device embodying a computer program of instructions executable by the computer for data acquisition from a signal by a digital instrument having a bandwidth, the instructions comprising:
  (a) receiving a signal and associated trigger;
  (b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger and overlapping the span of the acquisition records of step (b) such that the ending portion of one compensated acquisition record corresponds to a beginning portion of another;
  (c) subsequent to step (b), processing acquisition record with DSP techniques to produce compensated acquisition record corrected for the at least one known error mechanism;
  (d) repeating sequenced pairs steps (b) and (c) at least one time;
  (e) subsequent each instance of step (d), incorporating associated compensated acquisition record into resultant acquisition record as segment thereof corresponding to continuous fractional segment of signal whose signal values were sampled in associated instance of step (b);
  (f) receiving additional signal and additional associated trigger; and
    repeating steps (b) thru (e) for additional signal and additional associated trigger.

14. The computer readable memory device as recited in claim 9, wherein the spans of the acquisition records of step (b) are different from one another.

15. The computer readable memory device as recited in claim 9, wherein the digital instrument is a digital oscillographic instrument.

16. A computer readable memory device embodying a computer program of instructions executable by the computer for data acquisition from a signal by a digital instrument having a bandwidth, the instructions comprising:
  (a) receiving a signal and associated trigger;
  (b) based on the associated trigger, sampling at multiple time intervals a plurality of signal values to create an acquisition record representing continuous fractional segment of the signal, the plurality of samples meeting Nyquist requirement for the bandwidth but in error according to at least one known error mechanism, and the plurality of samples being located time relative to the associated trigger;
  (c) subsequent to step (b), processing acquisition record with DSP techniques to produce compensated acquisition record corrected for the at least one known error mechanism;
  (d) repeating sequenced pairs steps (b) and (c) at least one time;
  (e) subsequent each instance of step (d), incorporating associated compensated acquisition record into resultant acquisition record as segment thereof corresponding to continuous fractional segment of signal whose signal values were sampled in associated instance of step (b);
  (f) receiving additional signal and additional associated trigger;
    repeating steps (b) thru (e) for additional signal and additional associated trigger;
    receiving a second additional signal and a second additional associated trigger, wherein the second additional associated trigger is the same as the additional associated trigger; and
    repeating steps (b) thru (e) for the second additional signal.

17. A method as in claim 3, further comprising the step of: displaying the data comprising at least one compensated acquisition record.

18. A method as in claim 3, wherein the spans of the acquisition records of step (b) are different from one another.

19. A method as in claim 3, wherein the digital instrument is a digital oscillographic instrument.

20. A method as in claim 4, further comprising the step of: displaying the data comprising at least one compensated acquisition record.

21. A method as in claim 4, wherein the spans of the acquisition records of step (b) are different from one another.

22. A method as in claim 4, wherein the digital instrument is a digital oscillographic instrument.

23. A method as in claim 5, further comprising the step of: displaying the data comprising at least one compensated acquisition record.

24. A method as in claim 5, wherein the spans of the acquisition records of step (b) are different from one another.

25. A method as in claim 5, wherein the digital instrument is a digital oscillographic instrument.

26. A method as in claim 8, further comprising the step of: displaying the data comprising at least one compensated acquisition record.

27. A method as in claim 8, wherein the spans of the acquisition records of step (b) are different from one another.

28. A method as in claim 8, wherein the digital instrument is a digital oscillographic instrument.

29. The computer readable memory device as recited in claim 11, further comprising:

displaying the data comprising at least one compensated acquisition record.

30. The computer readable memory device as recited in claim 11, wherein the spans of the acquisition records of step (b) are different from one another.

31. The computer readable memory device as recited in claim 11, wherein the digital instrument is a digital oscillographic instrument.

32. The computer readable memory device as recited in claim 12, further comprising:

displaying the data comprising at least one compensated acquisition record.

33. The computer readable memory device as recited in claim 12, wherein the spans of the acquisition records of step (b) are different from one another.

34. The computer readable memory device as recited in claim 12, wherein the digital instrument is a digital oscillographic instrument.

35. The computer readable memory device as recited in claim 13, further comprising:

displaying the data comprising at least one compensated acquisition record.

36. The computer readable memory device as recited in claim 13, wherein the spans of the acquisition records of step (b) are different from one another.

37. The computer readable memory device as recited in claim 13, wherein the digital instrument is a digital oscillographic instrument.

38. The computer readable memory device as recited in claim 16, further comprising:

displaying the data comprising at least one compensated acquisition record.

39. The computer readable memory device as recited in claim 16, wherein the spans of the acquisition records of step (b) are different from one another.

40. The computer readable memory device as recited in claim 16, wherein the digital instrument is a digital oscillographic instrument.

\* \* \* \* \*